United States Patent
Su et al.

(10) Patent No.: US 7,205,844 B2
(45) Date of Patent: Apr. 17, 2007

(54) LOW NOISE AND HIGH GAIN LOW NOISE AMPLIFIER

(75) Inventors: Jiong-Guang Su, Keelung (TW); Tsyr-Shyang Liou, Taoyuan County (TW); Shyh-Chyi Wong, Taipei (TW)

(73) Assignee: RichWave Technology Corp., Taipei (TW)

( * ) Notice: Subject to any disclaimer, the term of this patent is extended or adjusted under 35 U.S.C. 154(b) by 169 days.

(21) Appl. No.: 10/905,964

(22) Filed: Jan. 28, 2005

(65) Prior Publication Data

US 2006/0097786 A1    May 11, 2006

(30) Foreign Application Priority Data

Nov. 8, 2004    (TW) ............... 93134022 A

(51) Int. Cl.
   *H03F 3/45*    (2006.01)
   *H03F 3/191*   (2006.01)
(52) U.S. Cl. .................... 330/301; 330/302
(58) Field of Classification Search ........ 330/253, 330/301, 302
   See application file for complete search history.

(56) References Cited

U.S. PATENT DOCUMENTS 4,366,446 A * 12/1982 Henderson et al. ......... 330/260

\* cited by examiner

*Primary Examiner*—Steven J. Mottola
(74) *Attorney, Agent, or Firm*—Winston Hsu

(57) ABSTRACT high-gain and low-noise low noise amplifier (LNA) includes a differential amplifier, a pre-amplifier and an impedance matching network. The differential amplifier includes a first input end and a second input end coupled to a grounded impedance. The pre-amplifier includes an input end and an output end. The impedance matching network is coupled between the first input end of the differential amplifier and the output end of the pre-amplifier for matching an input impedance of the differential amplifier with an output impedance of the pre-amplifier. The present invention provides a LNA structure with low noise, high gain and easy design.

5 Claims, 6 Drawing Sheets

LOW NOISE AND HIGH GAIN LOW NOISE AMPLIFIER

BACKGROUND OF INVENTION

1. Field of the Invention

The present invention relates to a low noise amplifier, and more particularly, to a low-noise and high-gain low noise amplifier.

2. Description of the Prior Art

With the widespread usage of cellular phones, mobile communication has become an integral part of daily life. Many design companies endeavor to improve every circuit block of the communication system. Low noise amplifiers (LNAs) belong to the receiver part of a communication system, with the function to enlarge received signals and to suppress the receiver's noise.

Commonly, LNA structure is based on a single-input-to-single-output design. In this structure the input end of the mixer that follows the LNA has to be single-ended as well. This design has limited ability to reduce the common mode noise of the mixer and the signal leaked from the oscillator to the mixer. Applying a differential output structure to the LNA can solve the problem. The most simple and common way to achieve a LNA with a differential output is by designing a differential-input-to-differential-output structure. This structure requires an extra transformer to convert a single-ended signal received at the antenna to a differential signal at the output end. This transformer not only adds extra cost to the capital, but its power loss also increases the NF (Noise Figure) of the entire receiver and encumbers system performance. Therefore, the preferred design for a receiver is a LNA with a single-input-to-differential-output structure.

Please refer to FIG. 1. FIG. 1 is a diagram of a prior art LNA 10 based on a single-input-to-differential-output design. The LNA 10 includes a transformer 12 and a differential amplifier 14. The transformer 12 is a passive single-input-to-differential-output transformer formed by the metal coils on the integrated circuit. The differential amplifier 14 comprises a differential pair of transistors M2 and M3, and an output impedance $Z_L$ for matching the output impedance seen into RFout. The transformer 12 is coupled to the differential amplifier 14 to amplify the high frequency signal entering at the input end RFin. The metal coils of the transformer 12 occupy large areas of the circuit layout and add to manufacturing costs.

Please refer to FIG. 2. FIG. 2 is a diagram of a prior art LNA 20 based on a single-input-to-differential-output design. The LNA 20 includes a first-end input impedance 21, a second-end input impedance 22 and a differential amplifier 24. The differential amplifier 24 comprises a differential pair of transistors M2 and M3, and an output matching impedance $Z_L$. The gate of one of the differential pair transistors is coupled to ground through the second-end input impedance 22. The gate of the other transistor is coupled to the input end RFin through the first-end input impedance 21. The prior art LNA structure 20 is advantageous over the prior art LNA structure 10 in that it removes metal coils serving as transformers, saves more space for other circuitry and reduces manufacturing costs. When a differential amplifier is operated at high frequencies, however, the current source Is used to bias the differential pair cannot be viewed as an ideal high impedance current source. Thus, when designing for the noise and gain for the prior art LNA 20, the transistor M2 cannot be treated as a common-source structure. Therefore the prior art LNA 20 requires complicated impedance matching designed at both input end and output end.

If a metal coil transformer is used to achieve a single-input-to-differential-output LNA structure, large areas on the circuit will be occupied, raising manufacturing costs. On the other hand, if a single-input-to-differential-output LNA structure is achieved by grounding one input end of the LNA, as demonstrated in prior art LNA 20, the high frequency impact of the current source on the differential transistors has to be taken into consideration. This high frequency characteristic of a non-ideal current source increases the complexity when designing the noise and gain for the LNA.

SUMMARY OF INVENTION

It is therefore a primary objective of the claimed invention to provide a low noise amplifier (LNA) with high gain and low noise performance and a related method to design the LNA.

Briefly described, the claimed invention discloses a high-gain low noise amplifier comprising a differential amplifier, a pre-amplifier and an impedance matching network. The differential amplifier comprises a first input end and a second input end coupled to a grounded impedance. The pre-amplifier comprises an input end and an output end. The impedance matching network is coupled between the first input end of the differential amplifier and the output end of the pre-amplifier for matching an input impedance of the differential amplifier with an output impedance of the pre-amplifier.

It is an advantage of the present invention that the LNA has low NF (Noise Figure), high power gain and is easy to design when compared to prior arts.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
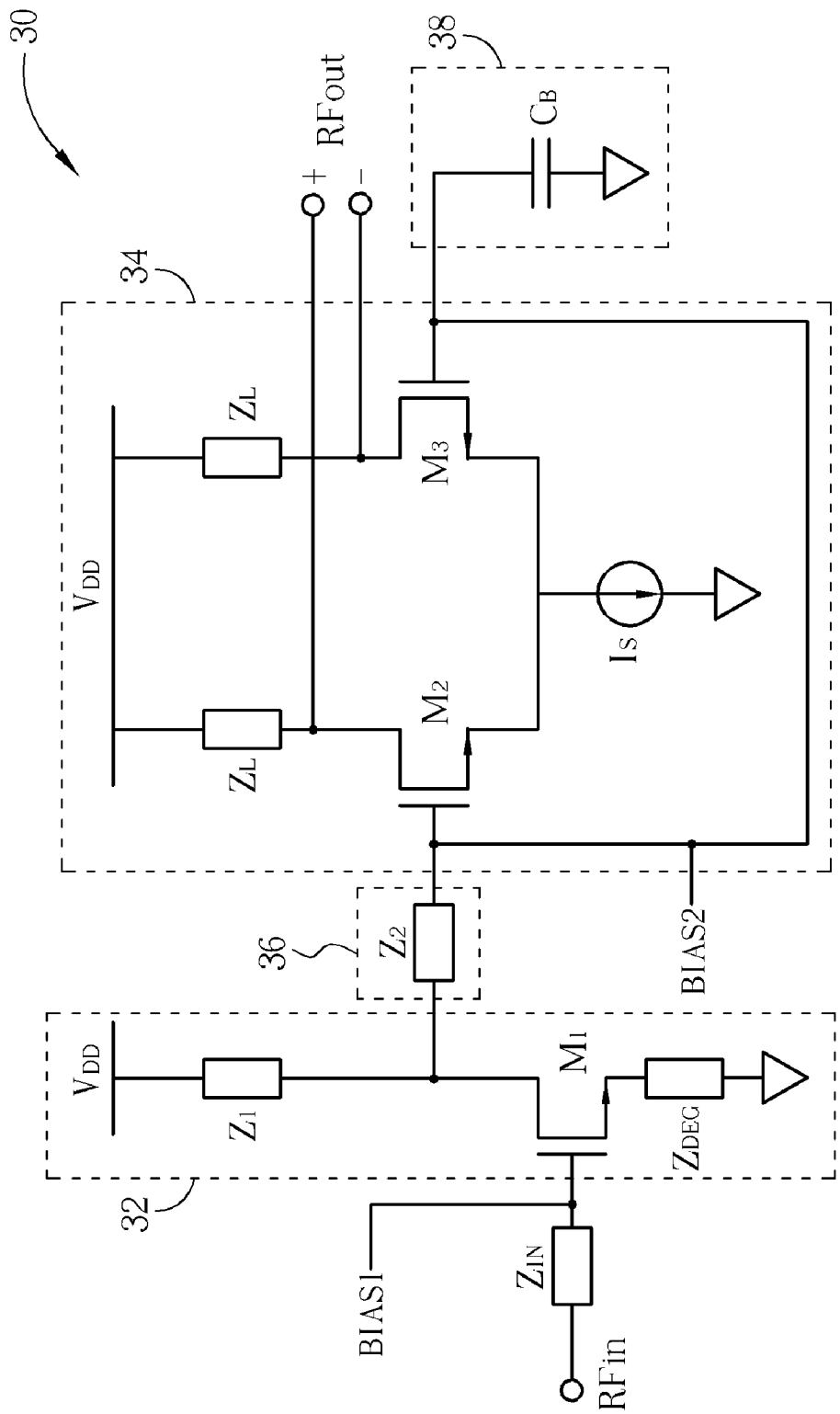
FIG. 3 is a diagram of a first embodiment of a high-gain LNA of the present invention.

Please address to FIG. 3. FIG. 3 is a diagram of a high-gain LNA 30 according to a first exemplary embodiment of the present invention. The LNA 30 comprises a pre-amplifier 32, a differential amplifier 34, an impedance matching network 36 and a grounded impedance 38. In this prior art embodiment, the differential amplifier 34 includes a transistor M2 and a transistor M3 forming a differential pair. A load $Z_L$ is connected between the power supply $V_{DD}$ and a drain of the transistor M2 and a drain of the transistor M3, respectively. The drains of transistor M2 and M3 represent the differential output ends of the LNA 30. The gates of the transistors M2 and M3 represent the differential input ends of the differential amplifier 34. One input end of the differential amplifier 34 (the gate of transistor M3) is coupled to ground through the impedance 38. In this embodiment the impedance 38 is a capacitor $C_B$ for isolating DC signals to the ground for the transistor M3. The impedance matching network 36 is coupled between the other input end of the differential amplifier 34 (the gate of the transistor M4) and the output end of pre-amplifier 32.

Those skilled in the art know that when the frequency of a signal is higher than a certain level, for example radio frequency, the parasitics of the transistors in the circuit become major factors that affect the entire system high frequency characteristics. At the same time, the transmission of high frequency signals has to be considered in view of electromagnetic waves to predict system performance more accurately.

In the case of a high frequency system, the signal transmission depends upon the impedance of related circuit blocks. When a high frequency signal is transmitted from a circuit block to the next circuit block with a different impedance, part of the signal is reflected. This reduces the effectiveness of signal transmission at high frequencies. To solve this problem, impedance matching must be taken into account when designing for high frequency signal transmission.

In FIG. 3, the impedance matching network 36 is designed between the pre-amplifier 32 and the differential amplifier 34 in order to match the impedance of the two amplifiers. The pre-amplifier 32 is a single-input-to-single-output amplifier, comprising a common-source transistor M1 and a loaded matching impedance Z1. A source of the transistor M1 is coupled to ground through a degeneration impedance $Z_{DEG}$. A drain of the transistor M1 is coupled to the loaded matching impedance Z1. A gate of the transistor M1 is an input end of the pre-amplifier 32. In the LNA 30 of present invention, an input signal enters from one end of an input impedance Zin, and is amplified by the pre-amplifier 32, as demonstrated in FIG. 3.

The purpose of the present invention is to achieve a high-gain LNA with a single-input-to-differential-output structure. The pre-amplifier 32 is implemented to accomplish low noise design. According to Friis' equation, the NF (Noise Figure) of the LNA 30 indicated in FIG. 3 is decided by the NF of the transistor M1. Friis' equation is as follows:

$$F_{LNA} \cong F_1 + \frac{F_2 - 1}{G_{A1}}$$

where $F_{LNA}$ is the NF of the LNA 30

F1 is the NF contributed by the transistor M1

F2 is the NF contributed by the transistor M2 and the transistor M3 of the differential amplifier 34

$G_{A1}$ is the available power gain contributed by transistor M1

According to the equation, because of the available power gain $G_{A1}$ provided by the pre-amplifier 32, the impact of F2 on $F_{LNA}$ becomes insignificant. The main contributor to the NF of the entire system $F_{LNA}$ is the NF contributed by the pre-amplifier 32. Since the pre-amplifier 32 is a single-transistor amplifier, its NF is smaller than that of the differential amplifier 34. Thus, adding the pre-amplifier 32 not only improves the NF of the LNA 30, but also increases the available power gain of the LNA 30. From the design point of view, pre-amplifier 32 simplifies the design of the LNA 30, since the transistor M1 is the only factor to be considered during the optimization between the noise and gain of the system.

Figure 1:
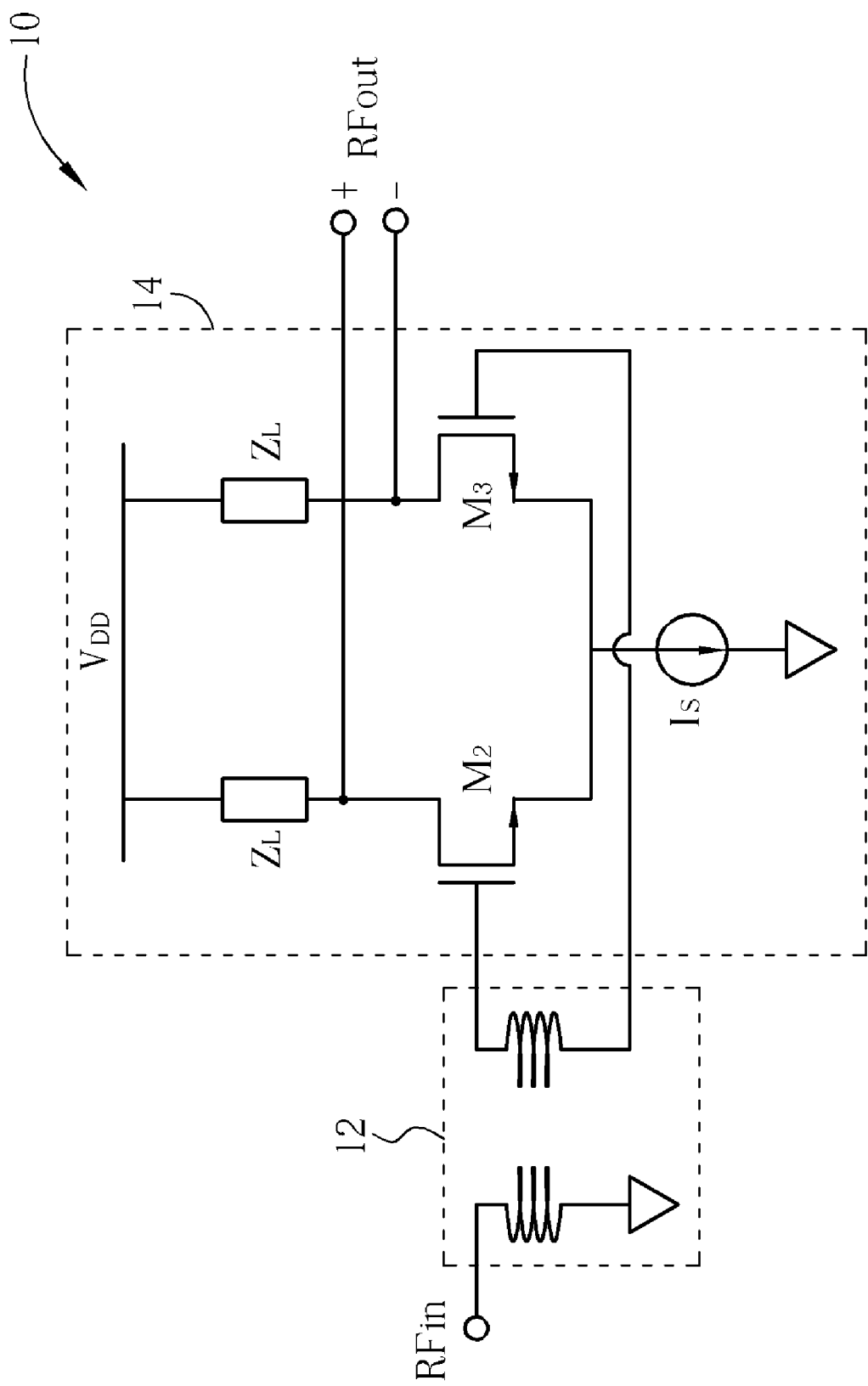
FIG. 1 is a diagram of a prior art single-input-to-differential-output LNA
Figure 2:
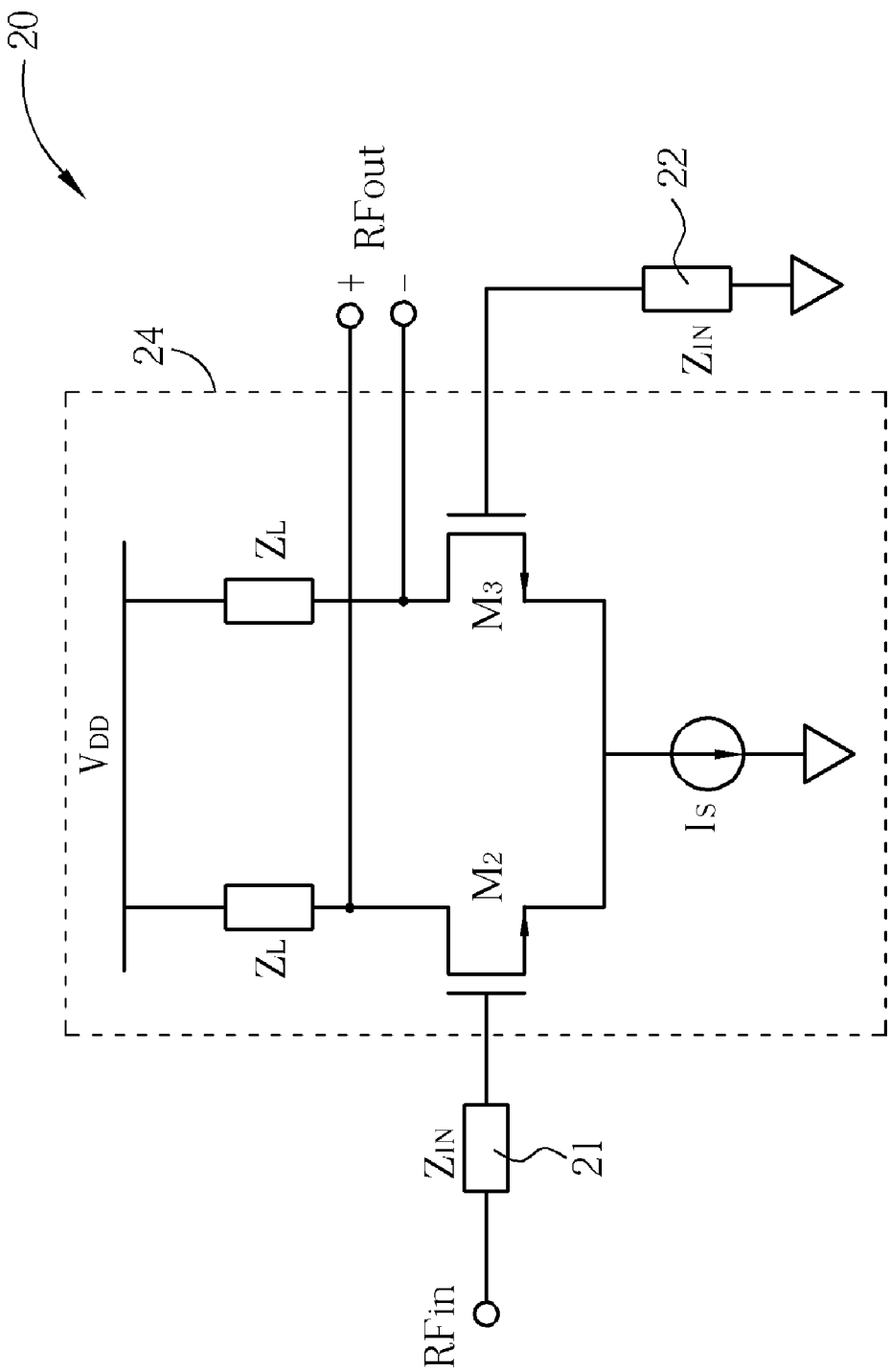
FIG. 2 is a diagram of another prior art single-input-to-differential-output LNA

Compared to the prior art LNA 10 with the single-input-to-differential-output structure in FIG. 1, the present invention does not require large chip area for the passive transformer, and thus avoids the loss due to the passive transformer. According to Friis' equation, the first level loss directly contributes to the NF of the entire single-input-to-differential-output system. This loss is especially severe on a high loss substrate (ex: silicon substrate). Compared to the prior art LNA 20 with the single-input-to-differential-output structure in FIG. 2, the present invention has less noise and is easier to design. The complexity of designing a ground point for the LNA 20 at high frequencies results in the difficulty of matching both ends of the differential pair. Therefore in a real integrated circuit, the node of current source and the sources of the differential pair are not a virtual ground point. As a result, the current source inevitably contributes additional noise to the entire LNA.

The best embodiment of the present invention is performed with MOSFET (Metal-Oxide-Semiconductor Field-Effect Transistor) devices, but is not limited to MOSFET. The claimed invention can also be applied to bipolar junction transistors (BJT) and other active devices with an amplifying function. The transistor M1 in FIG. 3. can be replaced by a BJT device or other active devices with an amplifying function. In the following embodiments, the transistors M1, M2 and M3 corresponding to FIG. 3 can be MOSFETs, BJTs or any active device with an amplifying function and the exact device types are not exclusively mentioned.

Figure 4:
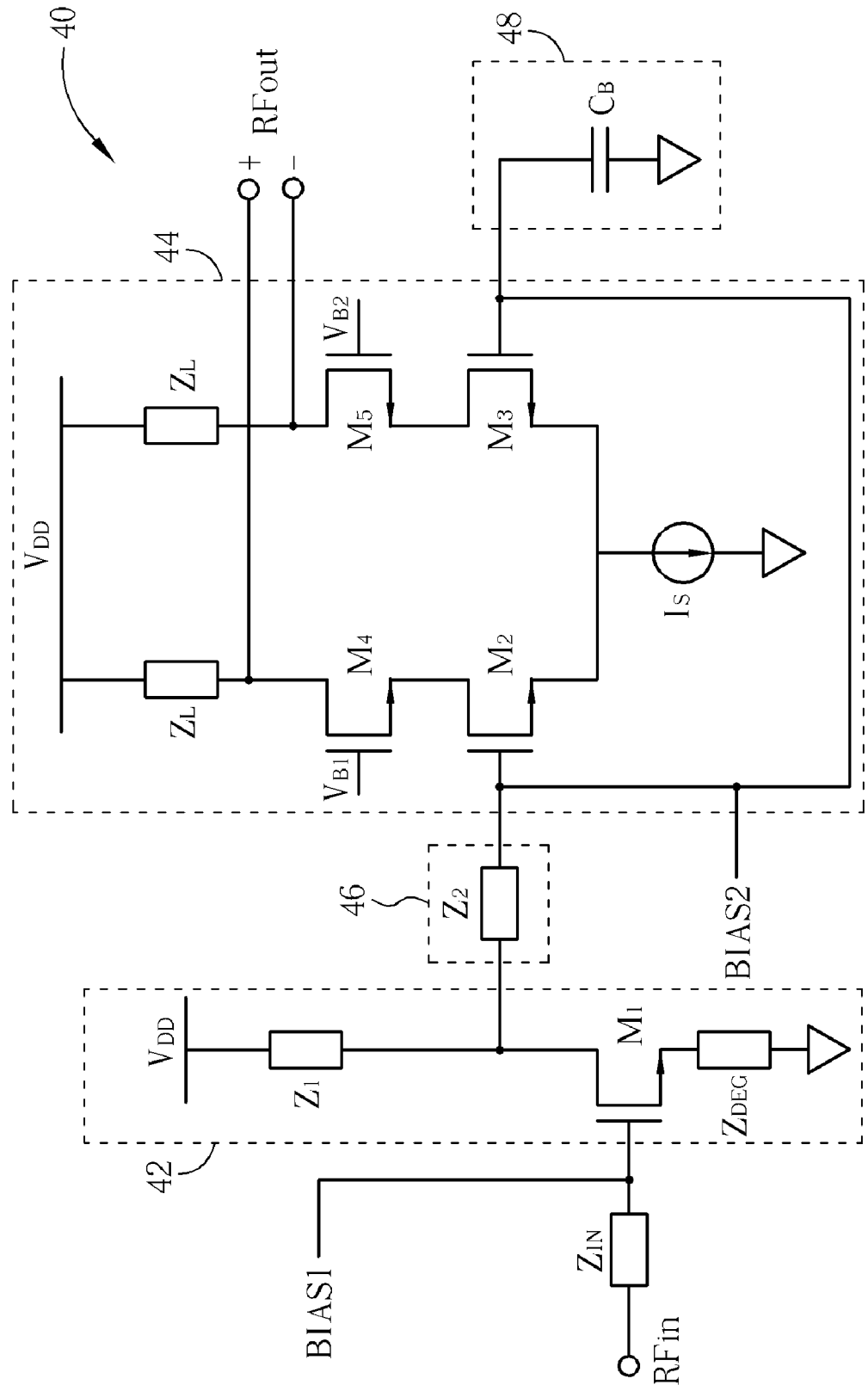
FIG. 4 is a diagram of a second embodiment of a high-gain LNA of the present invention.

Additionally, the differential pair comprised by the transistors M2 and M3 in FIG. 3 is not limited to a 2-transistor structure. The present invention also includes a differential pair with a cascode structure. Please refer to FIG. 4. FIG. 4 is a diagram of a second embodiment of a high-gain LNA 40 of the present invention. The LNA 40 includes a pre-amplifier 42, a differential amplifier 44, an impedance matching network 46 and a grounded impedance 48. Compared to the LNA 30 in the first embodiment of the present invention, the differential amplifier 44 comprises 4 cascode transistors, with the 2 extra transistors, M4 and M5 biased by VB1 and VB2, respectively. The transistors M4 and M5 increase the power gain of the differential amplifier 44 and improve its stability due to increased isolation.

Figure 5:
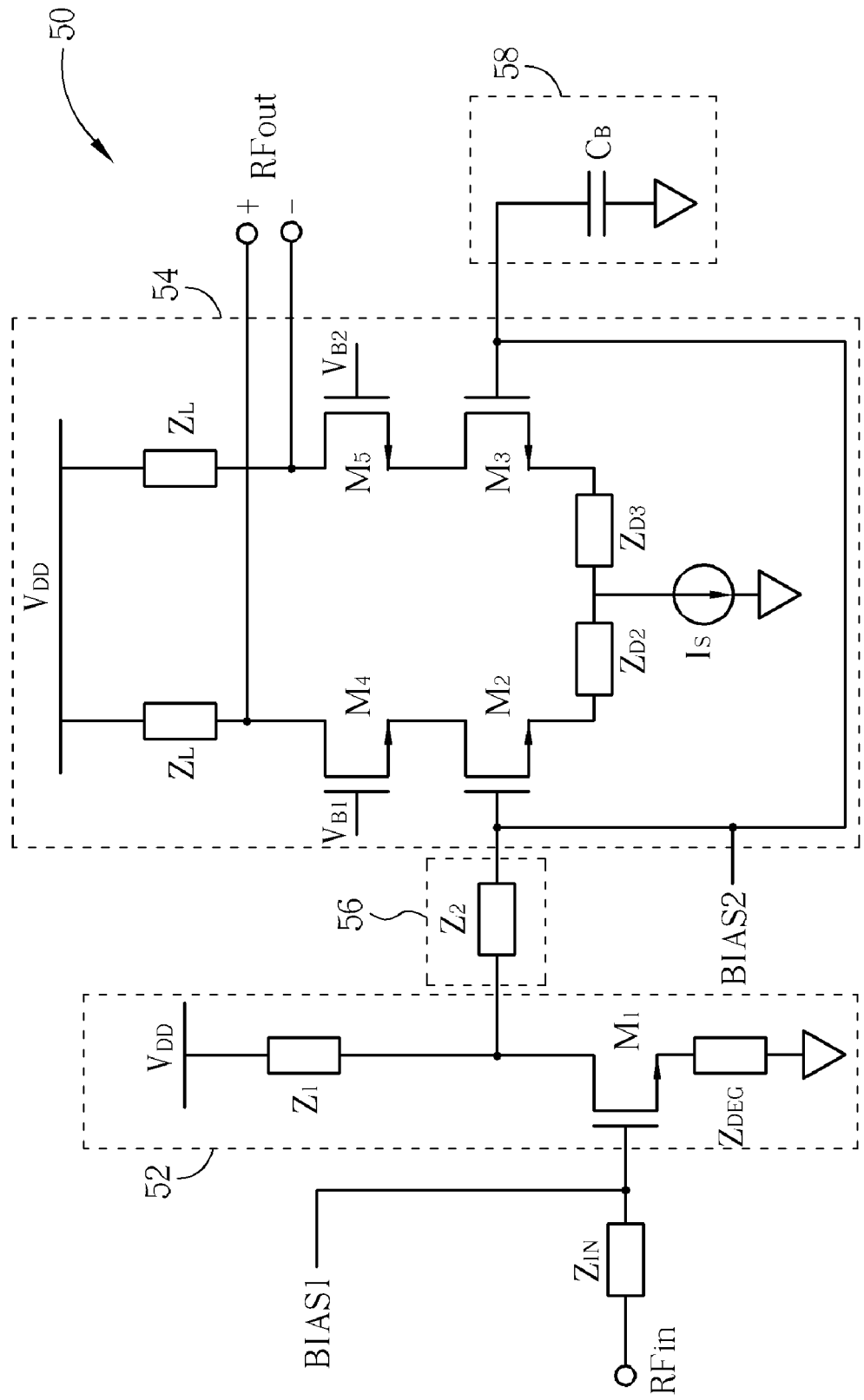
FIG. 5 is a diagram of a third embodiment of a high-gain LNA of the present invention.

Please refer to FIG. 5. FIG. 5 is a diagram of a third embodiment of a high-gain LNA 50 of the present invention. The LNA 50 is extended from the LNA 40. The LNA 50 includes a pre-amplifier 52, a differential amplifier 54, an impedance matching network 56 and a grounded impedance 58. In the differential amplifier 54 of the LNA 50, sources of the transistors M2 and M3 are in series connection to degeneration inductances $Z_{D2}$ and $Z_{D3}$, respectively. The series connection between the sources of the transistors M2 and M3 and the degeneration inductances $Z_{D2}$ and $Z_{D3}$ betters the linearity of the differential amplifier 54.

Figure 6:
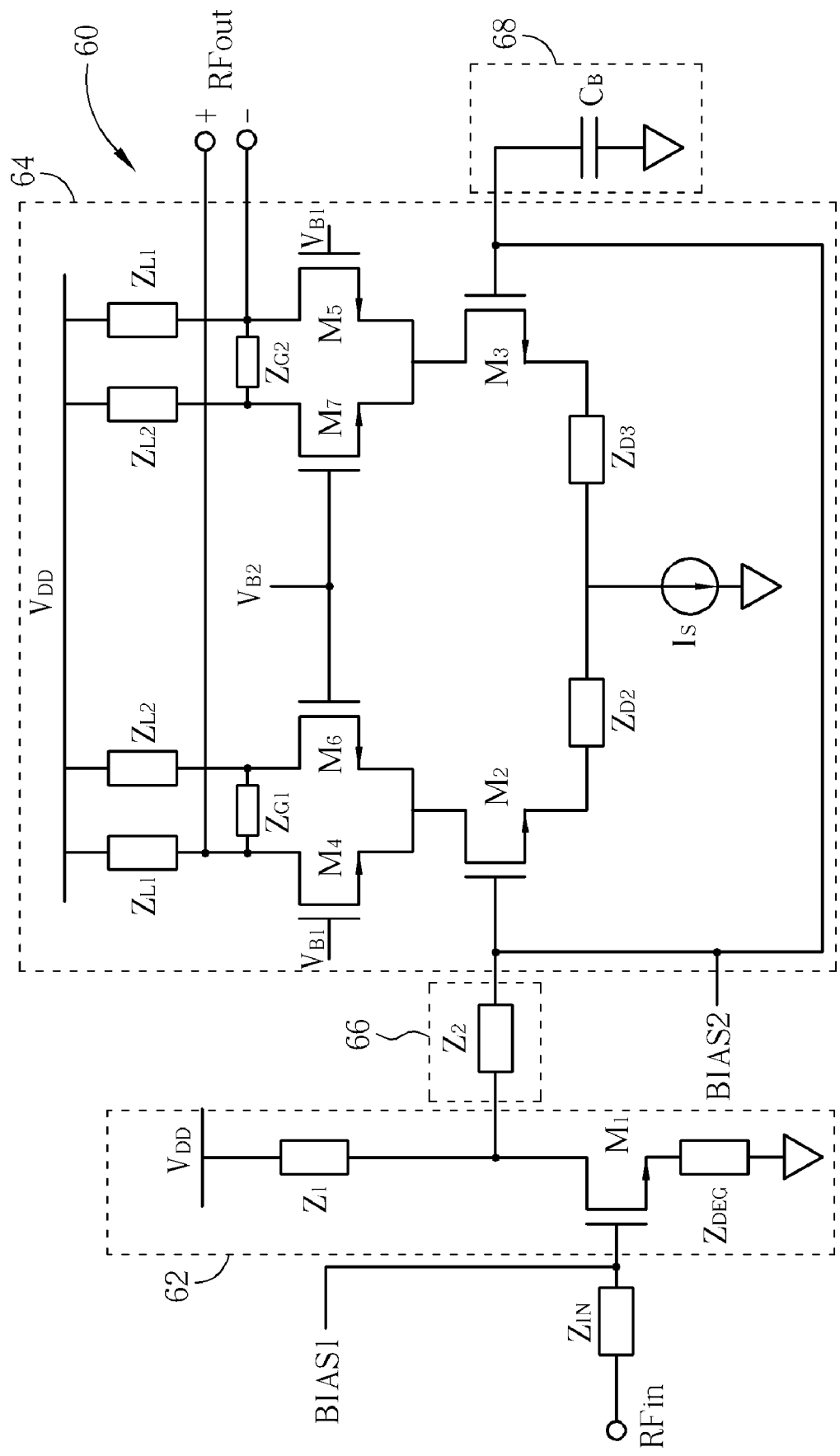
FIG. 6 is a diagram of a fourth embodiment of a high-gain LNA of the present invention.
Figure 3:
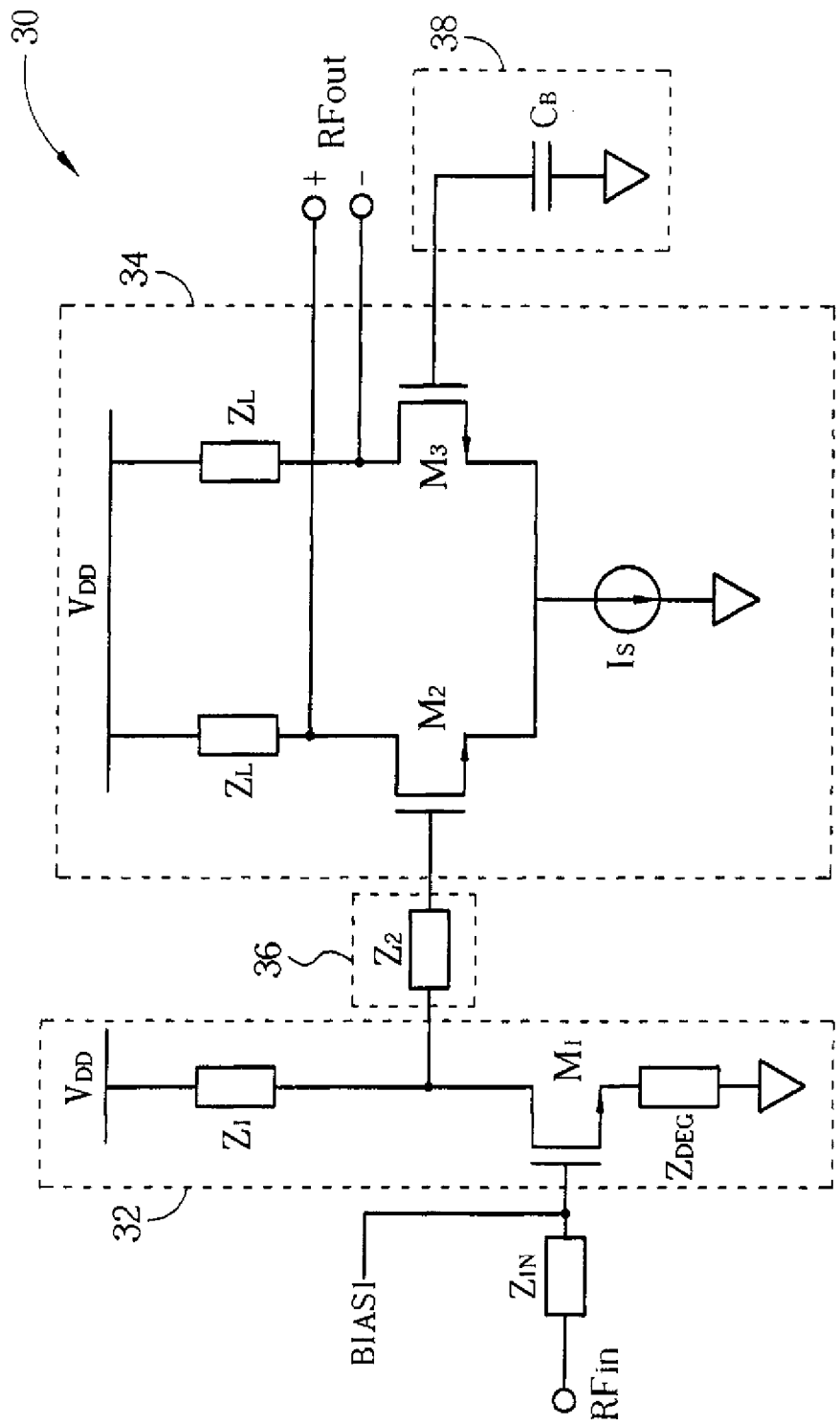
Figure 4:
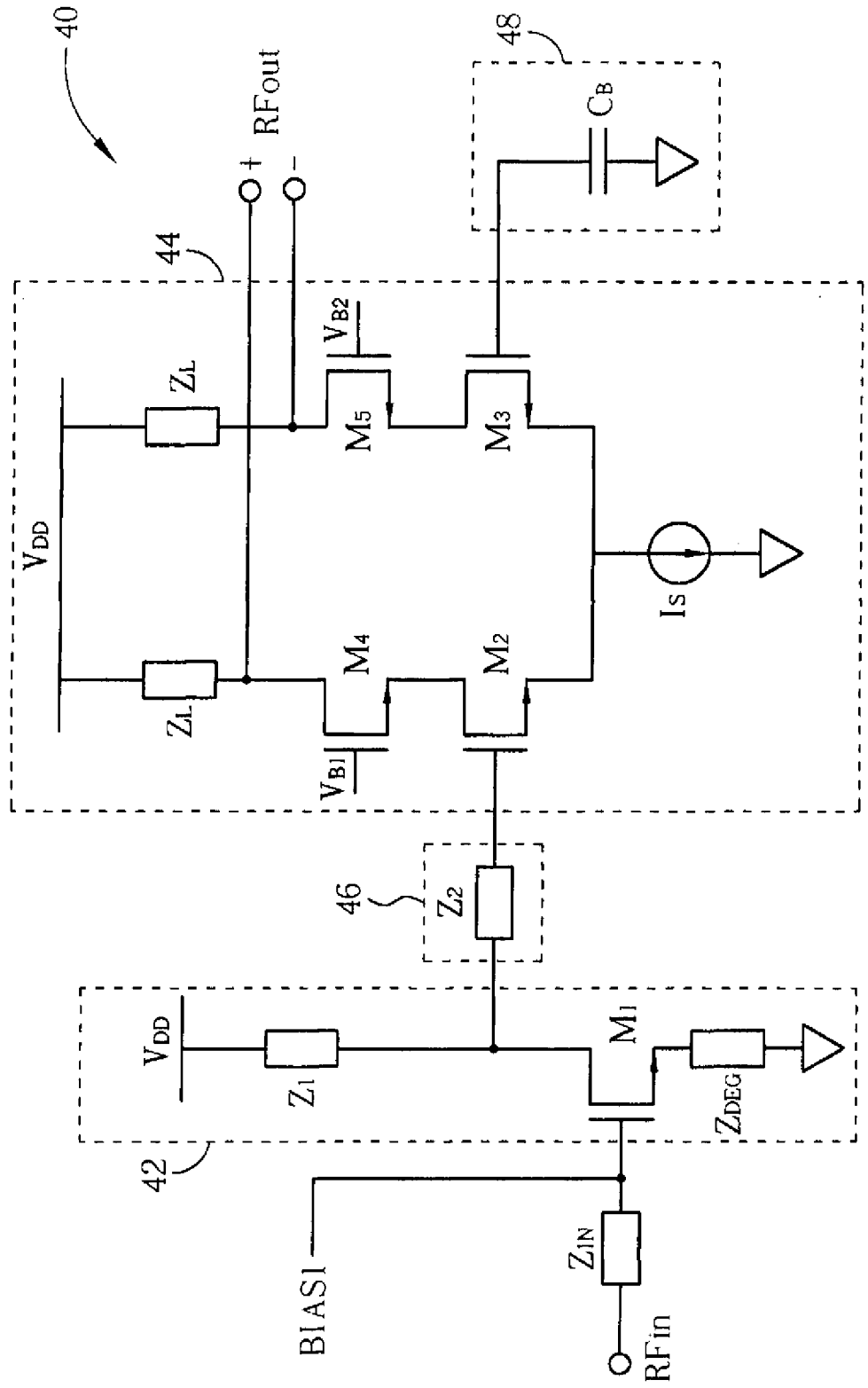
Figure 5:
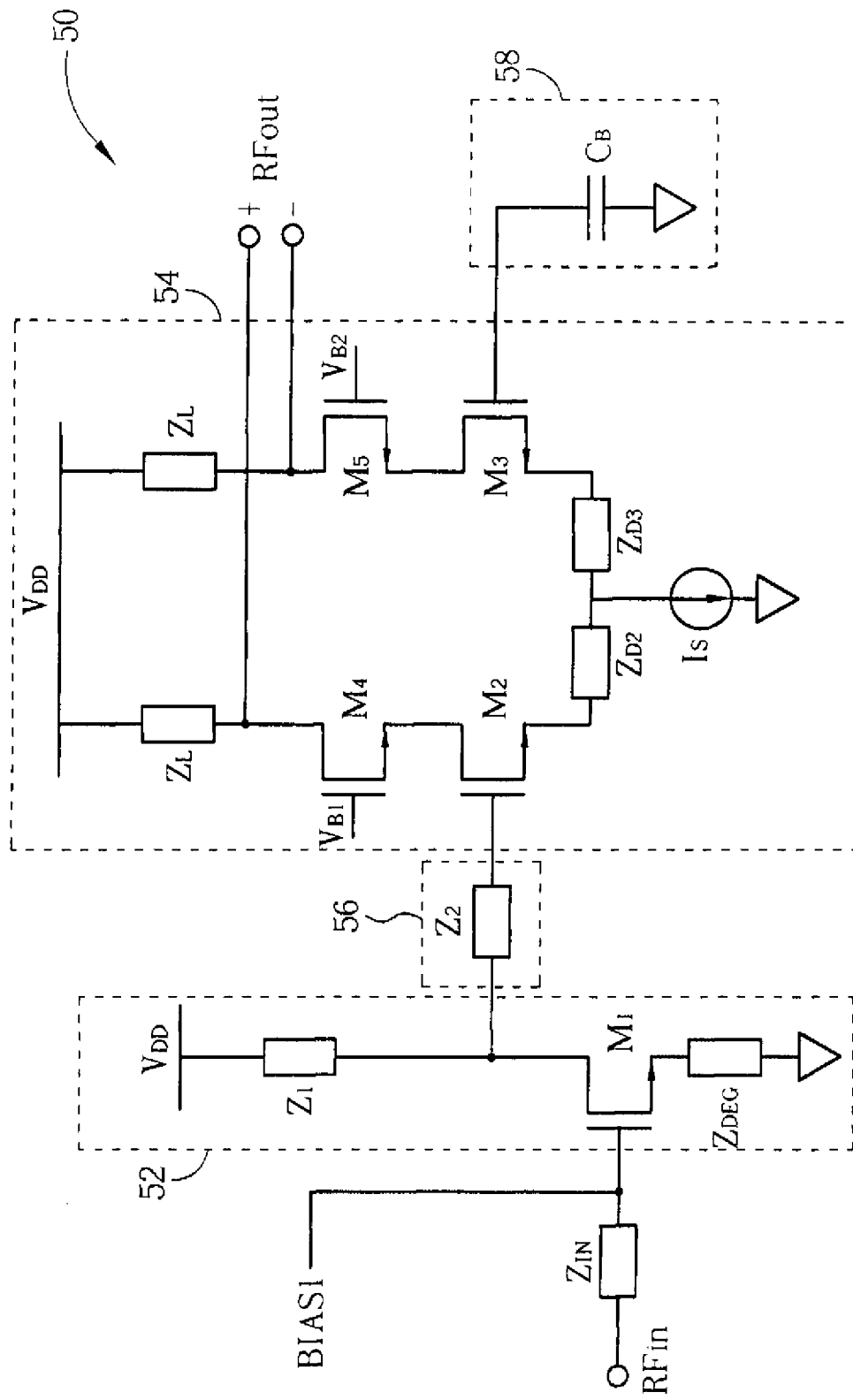
Figure 6:
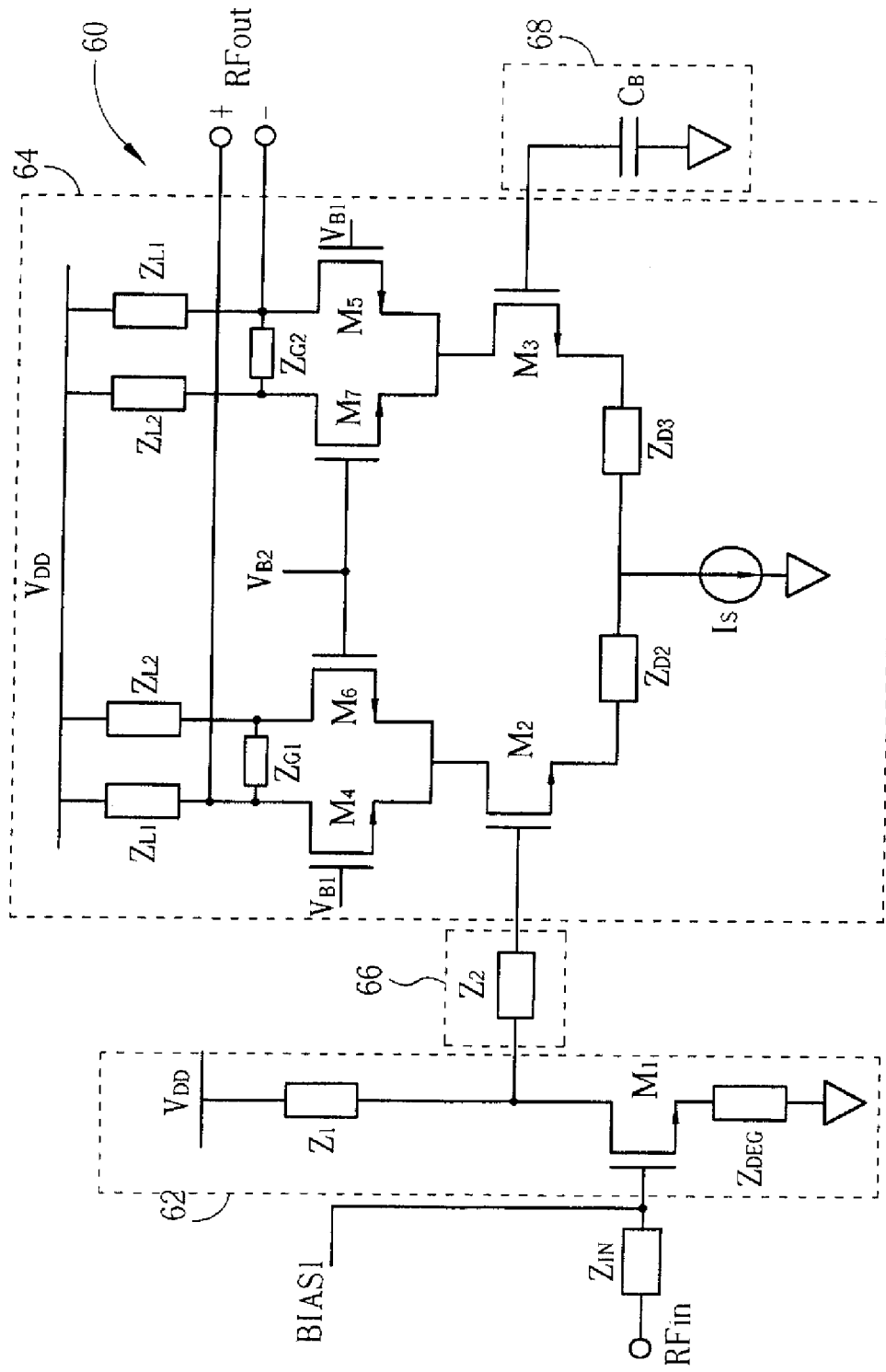

Please refer to FIG. 6. FIG. 6 is a diagram of a fourth embodiment of a high-gain LNA 60 of the present invention. The LNA 60 has a switching structure that provides 2 operating modes: high gain mode and low gain mode. The LNA 60 includes a pre-amplifier 62, a differential amplifier 64, an impedance matching network 66 and a grounded impedance 68. The differential amplifier 64 comprises 6 transistors M2 through M7. Drains of the transistors M4 and M5 are coupled to $V_{DD}$ through an impedance $Z_{L1}$, separately. The drains of transistor M6 and M7 are coupled to $V_{DD}$ through an impedance $Z_{L2}$, separately. An impedance $Z_{G1}$ is coupled between drains of the transistors M4 and M6, and an impedance $Z_{G2}$ is coupled between drains of the transistors M5 and M7. When the differential amplifier 64 operates under high gain mode, the transistors M4 and M5 remain on and the transistors M6 and M7 remain off. When a high frequency signal enters the differential amplifier 64, one part of the signal travels through the transistor M2, the transistor M4 and the impedance $Z_{L1}$, and reaches a positive end of RFout. The other part of the signal travels through the transistor M3, the transistor M5 and the impedance $Z_{L1}$, and reaches a negative end of RFout. Thus, an output differential signal from the original high frequency input signal is formed at both ends of RFout. Similarly, when the differential amplifier 64 operates under low gain mode, the transistors M6 and M7 remain on and the transistors M4 and M5 remain off. Therefore, the amplifier 64 serves as a passive network comprised by the impedances $Z_{L1}$, $Z_{L2}$ and $Z_{LG}$.

The prior art LNA 10 achieves a single-input-to-differential-output structure by implementing a metal coil transformer. Manufacturing costs and losses due to the passive transformer are two major drawbacks of this prior art. Using a different approach, the prior art LNA 20 achieves a single-input-to-differential-output structure by grounding one input end of the LNA 20. This prior art requires impedance matching at both ends of the differential pair transistors, and thus increases design complexity. The present invention achieves a single-input-to-differential-output structure by coupling one input end of the differential amplifier through a grounded impedance and defining the other input end of the differential amplifier from the pre-amplifier. In the present invention the main contributor to the NF of the differential amplifier is the pre-amplifier with a single-transistor structure. Thus the present invention has better noise performance. The pre-amplifier also increases the total power gain of the LNA in the present invention. And since the transistor M1 is the only factor to be considered during the optimization between the noise and gain of the entire system, it is simpler to design a LNA structure as demonstrated in the present invention. The single-input-to-differential-output structure of the high-gain and low noise LNA in the present invention is implemented by inserting one transistor in front of the differential pairs. Therefore the present invention discloses an innovation in the circuit topology to achieve a single-input-to-differential-output high-gain and low noise LNA. In conclusion, the present invention has several advantages: low noise, high gain and easy design.

Those skilled in the art will readily observe that numerous modifications and alterations of the device and method may be made while retaining the teachings of the invention. Accordingly, the above disclosure should be construed as limited only by the metes and bounds of the appended claims.

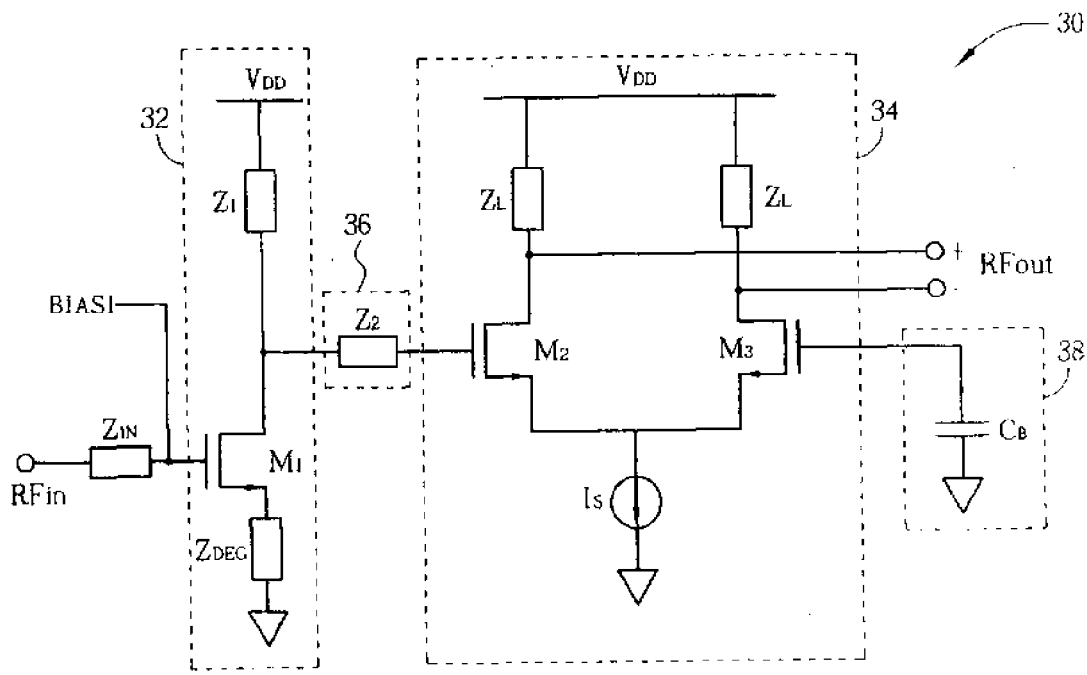

What is claimed is:

1. A high-gain and low-noise low noise amplifier (LNA) comprising:
    a differential amplifier comprising a first input end and a second input end coupled to a grounded impedance;
    a single transistor pre-amplifier comprising an input end and an output end wherein a drain of the single transistor is connected to a load; and
    an impedance matching network coupled between the first input end of the differential amplifier and the output end of the pre-amplifier for matching an input impedance of the differential amplifier with an output impedance of the pre-amplifier.

2. The high-gain LNA of claim 1 further comprising an input impedance coupled to the input end of the pre-amplifier.

3. The high-gain LNA of claim 1 wherein the pre-amplifier is a common-source single transistor amplifier further comprising:
    an impedance-matching load connected to the drain of the transistor; and
    a degenerate impedance coupled between the source of the transistor and ground.

4. The high-gain LNA of claim 1 wherein the second input end of the differential amplifier is coupled to a capacitance impedance.

5. The high-gain LNA of claim 1 wherein the differential amplifier has two differential output ends.

* * * * *

UNITED STATES PATENT AND TRADEMARK OFFICE
CERTIFICATE OF CORRECTION

| | | |
|---|---|---|
| PATENT NO. | : 7,205,844 B2 | Page 1 of 6 |
| APPLICATION NO. | : 10/905964 | |
| DATED | : April 17, 2007 | |
| INVENTOR(S) | : Su et al. | |

It is certified that error appears in the above-identified patent and that said Letters Patent is hereby corrected as shown below:

Please delete the old existing drawings and insert these new illustrated drawings that are attached.

Signed and Sealed this

Twenty-eighth Day of April, 2009

JOHN DOLL
*Acting Director of the United States Patent and Trademark Office*

(12) United States Patent
Su et al.

(10) Patent No.: US 7,205,844 B2
(45) Date of Patent: Apr. 17, 2007

(54) LOW NOISE AND HIGH GAIN LOW NOISE AMPLIFIER

(75) Inventors: Jiong-Guang Su, Keelung (TW); Tsyr-Shyang Liou, Taoyuan County (TW); Shyh-Chyi Wong, Taipei (TW)

(73) Assignee: RichWave Technology Corp., Taipei (TW)

(*) Notice: Subject to any disclaimer, the term of this patent is extended or adjusted under 35 U.S.C. 154(b) by 169 days.

(21) Appl. No.: 10/905,964

(22) Filed: Jan. 28, 2005

(65) Prior Publication Data
US 2006/0097786 A1 May 11, 2006

(30) Foreign Application Priority Data
Nov. 8, 2004 (TW) .............. 93134022 A

(51) Int. Cl.
*H03F 3/45* (2006.01)
*H03F 3/191* (2006.01)
(52) U.S. Cl. .............. 330/301; 330/302
(58) Field of Classification Search .............. 330/253, 330/301, 302
See application file for complete search history.

(56) References Cited
U.S. PATENT DOCUMENTS
4,366,446 A * 12/1982 Henderson et al. .......... 330/260

* cited by examiner

*Primary Examiner*—Steven J. Mottola
(74) *Attorney, Agent, or Firm*—Winston Hsu

(57) ABSTRACT high-gain and low-noise low noise amplifier (LNA) includes a differential amplifier, a pre-amplifier and an impedance matching network. The differential amplifier includes a first input end and a second input end coupled to a grounded impedance. The pre-amplifier includes an input end and an output end. The impedance matching network is coupled between the first input end of the differential amplifier and the output end of the pre-amplifier for matching an input impedance of the differential amplifier with an output impedance of the pre-amplifier. The present invention provides a LNA structure with low noise, high gain and easy design.

5 Claims, 6 Drawing Sheets